(12) United States Patent
Kobayashi et al.

(10) Patent No.: US 10,199,414 B2
(45) Date of Patent: *Feb. 5, 2019

(54) SEMICONDUCTOR DEVICE AND ELECTRONIC EQUIPMENT

(71) Applicant: SONY CORPORATION, Tokyo (JP)

(72) Inventors: Shoji Kobayashi, Kanagawa (JP); Yoshiharu Kudoh, Kanagawa (JP); Takuya Sano, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/496,614

(22) Filed: Apr. 25, 2017

(65) Prior Publication Data

US 2017/0338355 A1 Nov. 23, 2017

Related U.S. Application Data

(63) Continuation of application No. 14/374,720, filed as application No. PCT/JP2013/051527 on Jan. 25, 2013, now Pat. No. 9,634,158.

(30) Foreign Application Priority Data

Mar. 3, 2012 (JP) ................................. 2012-022516

(51) Int. Cl.
*H01L 27/146* (2006.01)
*H01L 31/0224* (2006.01)
(Continued)

(52) U.S. Cl.
CPC ...... *H01L 27/14625* (2013.01); *H01L 23/528* (2013.01); *H01L 23/5283* (2013.01);
(Continued)

(58) Field of Classification Search
CPC .............. H01L 31/00; H01L 31/02016; H01L 31/0203; H01L 31/0232; H01L 31/02327;
(Continued)

(56) References Cited

U.S. PATENT DOCUMENTS 5,163,179 A 11/1992 Pellegrini
6,885,047 B2 4/2005 Shinohara et al.
(Continued)

FOREIGN PATENT DOCUMENTS

CN 101840925 A 9/2010
JP 2005-150140 A 6/2005
(Continued)

OTHER PUBLICATIONS

Office Action for JP Patent Application No. 2013556361, dated Aug. 4, 2016, 07 pages.
(Continued)

*Primary Examiner* — Eduardo A Rodela
(74) *Attorney, Agent, or Firm* — Chip Law Group

(57) ABSTRACT

The present technology relates to a semiconductor device and electronic equipment in which a semiconductor device that suppresses the occurrence of noise by a leakage of light can be provided.
A semiconductor device is configured which includes a light-receiving element 34, an active element for signal processing, and a light shielding structure 40 which is between the light-receiving element 34 and the active element to cover the active element and is formed of wirings 45 and 46. The semiconductor device further includes a first substrate on which the light-receiving element is formed, a second substrate on which the active element is formed, and a wiring layer which has a light shielding structure by the wirings which is formed on the second substrate, and in
(Continued)

which the second substrate can be bonded to the first substrate through the wiring layer.

19 Claims, 8 Drawing Sheets

(51) Int. Cl.
    *H01L 31/0232*    (2014.01)
    *H01L 23/528*     (2006.01)
    *H01L 23/538*     (2006.01)
    *H01L 31/02*      (2006.01)
    *H01L 31/0216*    (2014.01)

(52) U.S. Cl.
    CPC ...... *H01L 23/5386* (2013.01); *H01L 27/1464* (2013.01); *H01L 27/14603* (2013.01); *H01L 27/14623* (2013.01); *H01L 27/14636* (2013.01); *H01L 27/14638* (2013.01); *H01L 31/02005* (2013.01); *H01L 31/02016* (2013.01); *H01L 31/0224* (2013.01); *H01L 31/02164* (2013.01); *H01L 31/02327* (2013.01)

(58) Field of Classification Search
    CPC ....... H01L 23/48; H01L 23/481; H01L 23/52; H01L 23/5226; H01L 23/528; H01L 23/5283; H01L 23/538; H01L 23/5384; H01L 23/5386; H01L 27/146; H01L 27/14603; H01L 27/14625; H01L 27/14636; H01L 27/14643
See application file for complete search history.

(56) References Cited

U.S. PATENT DOCUMENTS

| | | |
|---|---|---|
| 7,956,392 B2 | 6/2011 | Uya |
| 8,288,780 B2 | 10/2012 | Yang et al. |
| 8,441,090 B2 | 5/2013 | Tian et al. |
| 8,530,820 B2 | 9/2013 | Matsunuma |
| 8,669,602 B2 | 3/2014 | Hayashi |
| 8,698,064 B2 | 4/2014 | Otake et al. |
| 2004/0032518 A1* | 2/2004 | Benjamin ......... H01L 27/14623 348/294 |
| 2005/0230775 A1 | 10/2005 | Watanabe et al. |
| 2005/0236553 A1 | 10/2005 | Noto et al. |
| 2006/0108658 A1 | 5/2006 | Araki |
| 2006/0163628 A1 | 7/2006 | Mori et al. |
| 2007/0069258 A1 | 3/2007 | Ahn |
| 2007/0215204 A1 | 9/2007 | Maehara |
| 2007/0262299 A1 | 11/2007 | Kho et al. |
| 2010/0230582 A1 | 9/2010 | Ogawa et al. |
| 2010/0238331 A1 | 9/2010 | Umebayashi et al. |
| 2011/0233702 A1 | 9/2011 | Takahashi et al. |
| 2012/0199930 A1 | 8/2012 | Hayashi |
| 2014/0145288 A1* | 5/2014 | Hayashi .............. H01L 27/1461 257/435 |
| 2016/0035771 A1* | 2/2016 | Huang .................. H01L 31/024 438/67 |

FOREIGN PATENT DOCUMENTS

| | | |
|---|---|---|
| JP | 2008-235478 A | 10/2008 |
| JP | 2009-290000 A | 12/2009 |
| JP | 2010-219339 A | 9/2010 |
| JP | 2010-245499 A | 10/2010 |
| JP | 2010-245506 A | 10/2010 |

OTHER PUBLICATIONS

International Search Report for PCT Application No. PCT/JP2013/051527, dated Feb. 7, 2013.

Written Opinion of PCT Application No. PCT/JP2013/051527, dated February 19, 2013.

* cited by examiner

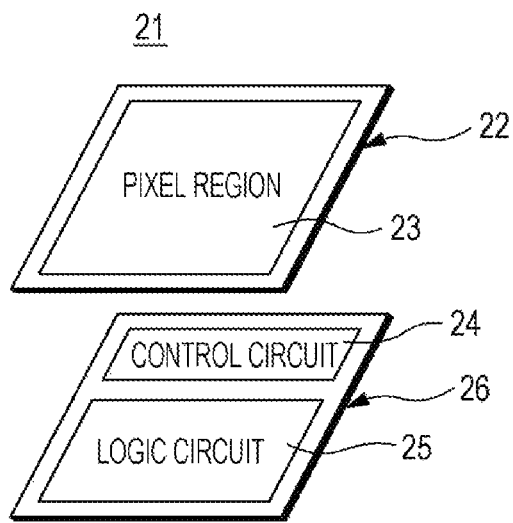
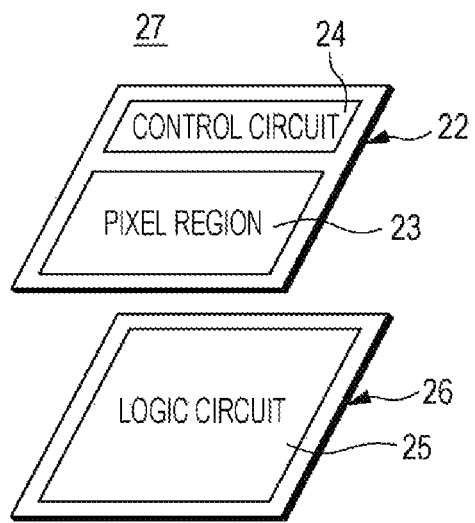
FIG. 2 (A)
FIG. 2 (B)

SEMICONDUCTOR DEVICE AND ELECTRONIC EQUIPMENT

TECHNICAL FIELD

The present technology relates to a semiconductor device and electronic equipment.

BACKGROUND ART

In recent years, an electronic camera is spread more and more, and thus demand for a semiconductor device, for example, a solid-state imaging device (image sensor), including a light-receiving element which is a center part of the electronic camera is continually increased. A technological development for realizing high image quality and high functionality in terms of performance is continued. On the other hand, not only a video camera or a portable camera, but also a mobile phone, a personal digital assistant (PDA), a laptop computer or the like is spread. With the spread, it becomes necessary to make the solid-state imaging device and parts thereof smaller, lighter, thinner for easy portability, and to make the cost of the solid-state imaging device and parts lower for widespread use.

In general, a solid-state imaging device, for example, an MOS type solid-state imaging device has a chip in which a photoelectric conversion unit or an amplifier circuit, and a multilayer wiring layer are formed on a silicon substrate and an on-chip microlens or a color filter is formed on the multilayer wiring layer. Furthermore, the solid-state imaging device is configured to have a terminal in the chip. Then, a chip mounted with a signal processing circuit for processing an output image is connected to the solid-state imaging device.

A chip mounted with a signal processing circuit for processing an output image is connected to the solid-state imaging device. As the solid-state imaging device is multi-functionalized, processing performed by the signal processing circuit also tends to be increased.

In order to obtain a plurality of these functions and make a plurality of chips smaller, various techniques are undertaken. For example, by inputting the plurality of chips in one package using a Silicon in Package (SIP) technology, miniaturization is performed. In this case, there is an advantage that the miniaturization can be realized by combining existing chips; however, since a transmission distance for connecting between chips is long and a fast connection is difficult, there is a problem that it is difficult to realize a fast operation.

On the other hand, there is an effort to make a fast transmission possible by joining a plurality of chips to each other to be bonded (refer to PTL 1).

CITATION LIST

Patent Literature

PTL 1: Japanese Unexamined Patent Application Publication No. 2010-245506

SUMMARY OF INVENTION

Technical Problem

However, in a semiconductor device including the above-mentioned light-receiving element, noises may occur due to leakage of light.

It is desirable to provide a semiconductor device and electronic equipment which can suppress the occurrence of noise due to the leakage of light.

Solution to Problem

The present invention provides a semiconductor device, including a light-receiving element, an active element for signal processing, and a light shielding structure which is between the light-receiving element and the active element to cover the active element and is formed of wirings.

In addition, electronic equipment of the present technology includes the semiconductor device and a signal processing circuit which processes an output signal of the semiconductor device.

The semiconductor device according to the present technology can suppress the occurrence of noises due to a leakage of light to the light-receiving element by including a light shielding structure which is between the light-receiving element and the active element to cover the active element and is formed of the wirings.

Furthermore, it is possible to configure electronic equipment having a high reliability by using the semiconductor device.

Advantageous Effects of Invention

According to the present technology, there is provided a semiconductor device and electronic equipment which can suppress the occurrence of noises due to a leakage of light.

BRIEF DESCRIPTION OF DRAWINGS

FIGS. 2(A) and 2(B) are schematic views which show a structure of the semiconductor device of the first embodiment.

DESCRIPTION OF EMBODIMENTS

Figure 1:
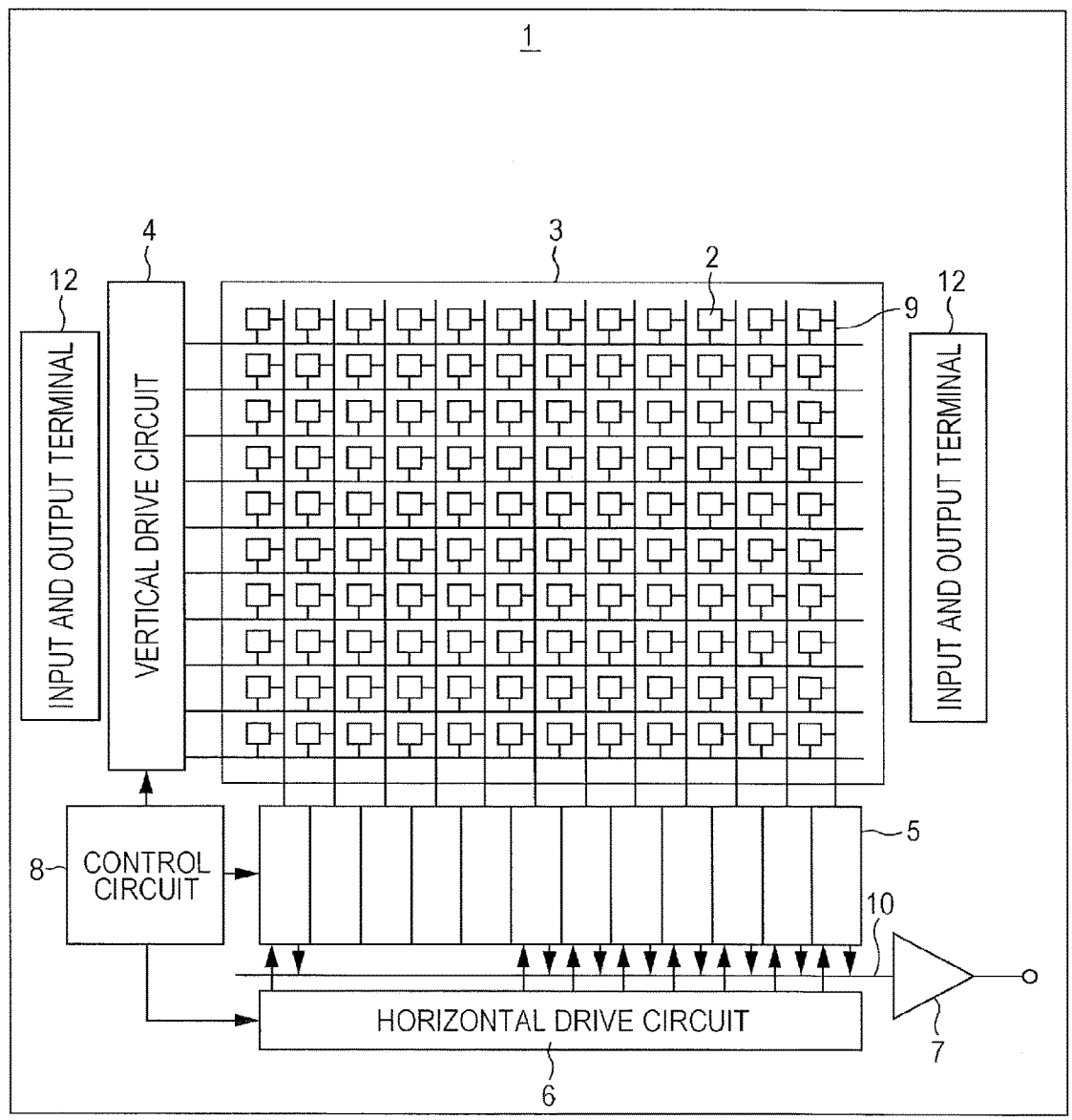
FIG. 1 is a plan view which shows a configuration of a semiconductor device of a first embodiment.

Hereinafter, examples in a best mode for performing the present technology will be described, however, the present technology is not limited to the following examples.

The description is performed in the following order.
1. Outline of a semiconductor device
2. First embodiment of the semiconductor device
3. Second embodiment of the semiconductor device
4. Modification example of the semiconductor device
5. Electronic equipment <1. Outline of a Semiconductor Device>

Hereinafter, the outline of a semiconductor device will be described using an example of a solid-state imaging device.

In general, various techniques are undertaken to obtain a plurality of functions and make a plurality of elements small in the solid-state imaging device. For example, by joining a plurality of substrates to each other to be bonded, an effort to make a fast transmission possible begins. However, in this case, a conversion element portion and a peripheral circuit portion are formed at a close distance, such that a characteristic problem of an image sensor occurs.

Since a photoelectric conversion element treats a very small carrier (electron) as a signal, an influence of heat or an electromagnetic field from a surrounding circuit is likely to be mixedly intruded as a noise. In addition, there is a problem that a leakage of very small hot carrier emissions which occur at a transistor or a diode configured in the peripheral circuit to a photoelectric conversion element has a large influence on image sensor characteristics.

The hot carrier emission is light emission caused by the generation combination of holes and electrons appearing when a carrier accelerated between a source and a drain collides and ionizes at a drain terminal, or a state transition of one of the two. Even a transistor without any characteristic problems has the light-emission which is a very small amount but constant. Light-emission diffuses in all directions. Accordingly, an influence becomes very small when spaced away from the transistor, but when the photoelectric conversion element and a circuit are placed very close to each other, light-emission does not diffuse that much, and a considerable number of photons are injected into the photoelectric conversion element.

In this manner, when the photoelectric conversion element and the active element are close to each other, and hot carrier emissions are not sufficiently diffused, the occurrence of distribution of hot carrier emissions caused by a difference between a transistor disposition density and an active ratio of a peripheral circuit is reflected on an image of the solid-state imaging device as two-dimensional information.

For this reason, it is necessary to have a configuration for light-shielding to suppress an amount of injection of hot carrier emissions into a photoelectric conversion element to be below a detection limit.

In addition, a very small amount of hot carrier emissions occurring at a transistor or a diode can have the same great influence on not only a photoelectric conversion element of the solid-state imaging device described above, but also, for example, a semiconductor device including a high sensitivity analog element.

That is, in the semiconductor device including a high sensitivity analog element, the high sensitivity analog element eventually becomes a light-receiving element for hot carrier emissions. Then, light from the host carrier emissions leaks into the high sensitivity analog element, and thereby noise occurs in the high sensitivity analog element. For this reason, this has an influence on characteristics of the semiconductor device. For example, since high density and multi-level are in progress in a device like a flash memory, there is a possibility that a holding value is changed when noises are mixedly intruded from outside.

Therefore, in the semiconductor device including the high sensitivity analog element, it is necessary to have a configuration for light-shielding to suppress an amount of injection of hot carrier emission into the light-receiving element (high sensitivity analog element) to be below a detection limit.

As described above, a configuration for shielding the hot carrier emission is necessary in a semiconductor device in which a light-receiving element and a peripheral circuit unit are configured at a close distance. Here, the close distance is a distance by which light from an active element such as hot carrier emission and the like is incident on the light-receiving element at an intensity that gives an influence on a signal of a photoelectric conversion element or a high sensitivity analog element without being sufficiently attenuated.

Therefore, in a structure in which a light-receiving element unit having the light-receiving element and a peripheral circuit unit of the light-receiving element unit are included and a peripheral circuit unit of the light-receiving element unit is configured at a close distance, the light shielding structure is formed in a region between the light-receiving element unit and the peripheral circuit unit. The light shielding structure combines two or more wiring layers and superimposes wirings on different wiring layers in a plane position, thereby preventing light from being leaked.

However, when superimposing wirings in an entire region between the light-receiving element unit and the peripheral circuit unit, flexibility of wiring disposition is significantly lowered, so that it is not efficient. For example, power lines when supplying power to a plurality of circuit blocks in the peripheral circuit unit are provided while branching and intersecting each other on the way. At a portion in which the light shielding structure is formed, it is difficult to superimpose wirings at a branch point and an intersection.

Thus, a plurality of active element groups provided in the peripheral circuit unit is divided into some circuit blocks. Then, each circuit block is defined as a light shielding target region, and a region between circuit blocks is defined as a light shielding non-target region.

In order to freely perform connection between the circuit blocks in the light shielding non-target region by setting only the light shielding target region to a light shielding target, a structure in which a light shielding performance and circuit flexibility are combined is provided.

<2. First Embodiment of Semiconductor Device>
[Schematic Configuration of Solid-State Imaging Device]

FIG. 1 shows a schematic configuration of the MOS type solid-state imaging device applied to the solid-state imaging device as an example of the semiconductor device of the embodiment. The solid-state imaging device 1 of the present example is configured to have a pixel region (so-called pixel array) 3 in which pixels 2 including a plurality of photoelectric conversion units are regularly arranged in a two-dimensional array shape on a semiconductor substrate not illustrated, for example, a silicon substrate, and a peripheral circuit unit. The pixels 2 are made of photoelectric conversion units, for example, photodiodes, and a plurality of pixel transistors (so-called MOS transistor). The plurality of pixel transistors can be configured using three transistors such as a transfer transistor, a reset transistor, and an amplification transistor. In addition, the plurality of pixel transistors can be also configured using four transistors by adding a selection transistor. Since an equivalent circuit of a unit pixel is the same as usual, a detailed description thereof is omitted. The pixels 2 can be configured as one unit pixel. Moreover, the pixels 2 can also share a pixel structure. The shared pixel structure is a structure that a plurality of photodiodes share a floating diffusion configuring a transfer transistor and another transistor other than the transfer transistor.

The peripheral circuit unit is configured to have a vertical drive circuit 4, a column signal processing circuit 5, a horizontal drive circuit 6, an output circuit 7, a control circuit 8, and the like.

The control circuit 8 receives an input clock and data which instructs an operation mode and the like, and outputs data such as internal information and the like of the solid-state imaging device. That is, the control circuit 8 generates a clock signal or a control signal which is a reference of operations of the vertical drive circuit 4, the column signal processing circuit 5, the horizontal drive circuit 6, and the like based on a vertical synchronization signal, a horizontal synchronization signal, and a master clock. Then, these signals are input to the vertical drive circuit 4, the column signal processing circuit 5, the horizontal drive circuit 6, and the like.

The vertical drive circuit 4 is configured from, for example, a shift register, selects a pixel driving wiring, supplies a pulse for driving a pixel to the selected pixel driving wiring, and drives the pixel row by row. That is, the vertical drive circuit 4 sequentially performs a selection scanning on each pixels 2 of a pixel region 3 row by row in a vertical direction, and supplies the pixel signal to the column signal processing circuit 5 based on a signal charge generated according to an amount of light received in, for example, a photodiode, which is a photoelectric conversion unit of each pixels 2 through a vertical signal line 9.

The column signal processing circuit 5 is disposed in, for example, each column of the pixels 2, and performs signal processing such as noise removal and the like in each pixel column on a signal output from the pixels 2 corresponding to one row. That is, the column signal processing circuit 5 performs a CDS for removing unique fixed pattern noise of the pixels 2, and signal processing such as signal amplification, AD conversion, and the like. At an output terminal of the column signal processing circuit 5, a horizontal selection switch (not illustrated) is provided to be connected between the output terminal and a horizontal signal line 10.

The horizontal drive circuit 6 is configured of, for example, a shift register, and sequentially selects each column signal processing circuit 5, and outputs a pixel signal from each column signal processing circuit 5 to a horizontal signal line 10 by sequentially outputting a horizontal scanning pulse.

The output circuit 7 performs signal processing on a signal successively supplied through the horizontal signal line 10 from each column signal processing circuit 5 and outputs the signal. For example, in some cases, only buffering is performed, or a black level adjustment, column variation correction, various digital signal processing, and the like are performed. The input and output terminal 12 transmits or receives a signal to or from outside.

Next, a structure of the MOS type solid-state imaging device according to the embodiment will be described. FIGS. 2(A) and 2(B) are schematic configuration views which show a structure of the MOS type solid-state imaging device according to the embodiment.

An MOS type solid-state imaging device 21 of the embodiment mounts a pixel region 23 on the first semiconductor chip unit 22 as shown in FIG. 2(A), and mounts a control circuit 24 and a logic circuit 25 including a signal processing circuit on the second semiconductor chip unit 26. The MOS type solid-state imaging device 21 is configured as one semiconductor chip by electrically connecting the first semiconductor chip unit 22 and the second semiconductor chip unit 26 to each other.

In addition, in the MOS type solid-state imaging device 27 in the embodiment, as shown in FIG. 2(B), the first semiconductor chip unit 22 is mounted with the pixel region 23 and the control circuit 24, and the second semiconductor chip unit 26 is mounted with the logic circuit 25 including a signal processing circuit for signal processing. The first semiconductor chip unit 22 and the second semiconductor chip unit 26 are electrically connected to each other, and thereby, the MOS type solid-state imaging device 27 is configured as one semiconductor chip.

Although not further illustrated, the MOS type solid-state imaging device in other embodiments mounts the pixel region 23 and a control circuit unit suitable for control of the pixel region which is a portion of the control circuit unit on the first semiconductor chip unit 22. Moreover, the logic circuit 25 and a control circuit unit suitable for control of the logic circuit which is another portion of the control circuit are mounted on the second semiconductor chip unit 26. The MOS type solid-state imaging device 27 is configured as one semiconductor chip by electrically connecting the first semiconductor chip unit 22 and the second semiconductor chip unit 26 to each other.

The MOS type solid-state imaging device according to the embodiment described above has a structure in which different types of semiconductor chips are stacked and has characteristics in a configuration to be described later.

[Cross-Sectional Configuration of a Solid-State Imaging Device]

Figure 3:
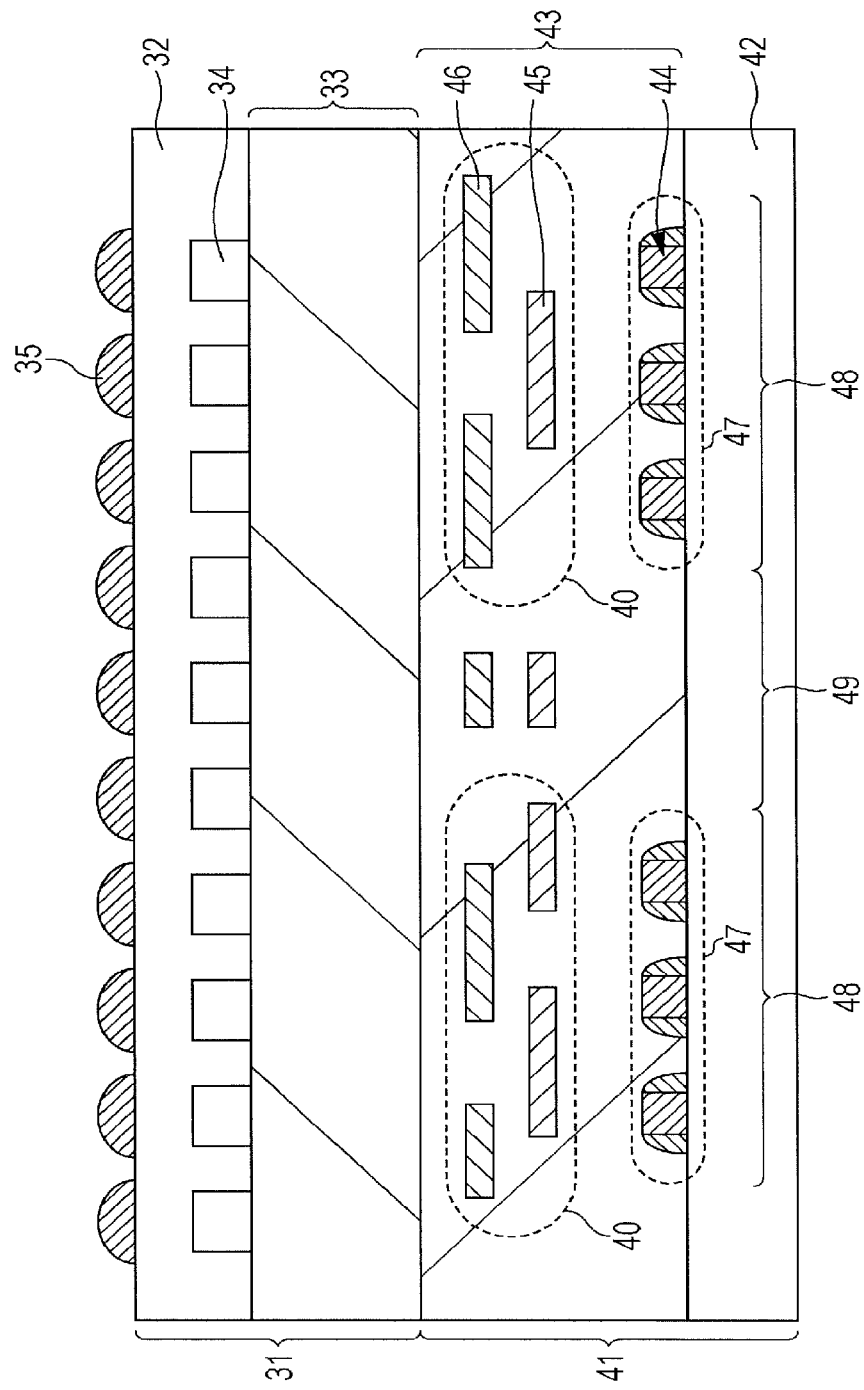
FIG. 3 is a cross-sectional view which shows a configuration of the semiconductor device of the first embodiment.

FIG. 3 shows a solid-state imaging device of the embodiment, particularly, a first embodiment of the MOS type solid-state imaging device. The MOS type solid-state imaging device of the embodiment is a rear surface-irradiated type solid-state imaging device. A configuration of FIG. 2(A) is applied to the MOS type solid-state imaging device of the embodiment; however, another configuration of FIG. 2(B) or a configuration in which a control circuit is divided into a first semiconductor chip unit and a second semiconductor chip unit and is mounted can also be applied thereto.

A solid-state imaging device according to a first embodiment is configured by joining a first semiconductor chip unit 31 and a second semiconductor chip unit 41 to each other. In the first semiconductor chip unit 31, a pixel array in which pixels made from a light-receiving element 34 such as a photodiode PD that is a photoelectric conversion unit and a plurality of pixel transistors are two-dimensionally arranged is formed.

The light-receiving element 34 is formed to have an n-type semiconductor region in a well region formed on the first semiconductor substrate 32 and a p-type semiconductor region on a surface side of the substrate. On the first semiconductor substrate 32 which configures a pixel, a pixel transistor is formed by a gate electrode which is formed through a gate insulation film that is not illustrated, and a source/drain region paired with the gate electrode.

On a surface side of the first semiconductor substrate 32, a multilayer wiring layer 33 on which a plurality of layers of wirings are disposed through an interlayer insulation film is formed. The wirings are formed of copper. In a pixel transistor and an MOS transistor of a control circuit, wirings of different wiring layers are connected to each other at a required place by a connection conductor passing through wiring layers.

On a rear surface of the first semiconductor substrate 32, for example, an anti-reflection film, a light-shielding film which shields a required region, and an optical member 35 such as a color filter, an on-chip microlens, or the like which is provided at a position corresponding to each photodiode PD are formed.

On the other hand, a control circuit of the solid-state imaging device and a logic circuit including a signal processing circuit for signal processing are formed in the second semiconductor chip unit 41. The control circuit and the logic circuit are made from, for example, a plurality of MOS transistors 44 which are formed in a p-type semiconductor well region of the second semiconductor substrate 42. The plurality of MOS transistors 44 are formed to have a pair of n-type source/drain regions which are not illustrated, and a gate electrode formed through a gate insulation film.

On the second semiconductor substrate 42, a multilayer wiring layer 43 including a plurality of wiring layers on which wirings are disposed through an interlayer insulation film is formed on the second semiconductor substrate 42. In FIG. 3, a first wiring 45 and a second wiring 46 of two-layer wirings are shown as a representative among wirings formed on a plurality of wiring layers.

In the semiconductor device of the embodiment, the multilayer wiring layer 33 of the first semiconductor chip unit 31, the multilayer wiring layer 43 of the second semiconductor chip unit 41, or a light shielding structure so as to perform a covering without a gap by superimposing wirings at both sides thereof are disposed. At this time, the light shielding structure is not formed so as to cover all of the pixel region and all of the logic circuit region, but the light shielding structure in which only the active element group 47 is set to a light shielding target is configured.

Here, in the second semiconductor chip unit 41, a region in which an active element such as the MOS transistor 44 and the like are formed is set to the active element group 47. In the second semiconductor chip unit 41, a circuit for realizing one function is configured by combining active elements such as a plurality of nMOS transistors, pMOS transistors, or the like. Each active element is disposed at a close distance to switch signals. In this manner, a plurality of active elements disposed at a close distance to realize one function are set to an active element group 47. Then, a region in which the active element group is formed is set to a circuit block. An active element formed in the second semiconductor chip unit 41 includes a diode and the like for protection formed in a semiconductor device besides the above-mentioned MOS transistor 44.

A circuit block in which the active element group 47 is formed is defined as a light shielding target region 48. In addition, a region between the active element groups 47 is defined as a light shielding non-target region 49. Then, in the multilayer wiring layer 43 of the second semiconductor chip unit 41, the light shielding structure 40 by the first wiring 45 and the second wiring 46 formed on a wiring layer different from the first wiring 45 is formed on the active element group 47. The light shielding structure which can prevent an influence of diffraction of light by disposing the first wiring 45 and the second wiring 46 to be superimposed on each other on a plane position to a certain extent, and suppress light so as not to be incident from the bottom is configured.

[Light Shielding Target Region]

Figure 4A:
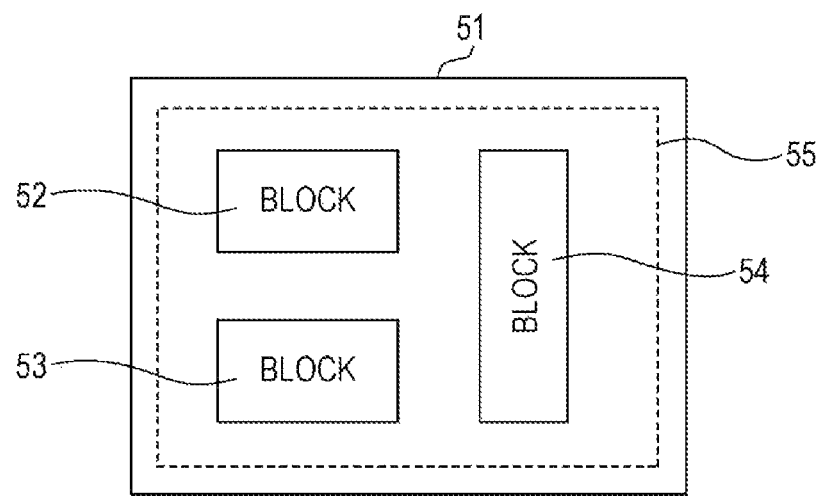
FIGS. 4(A) and 4(B) are views which show a planar disposition of circuit blocks.
Figure 4B:
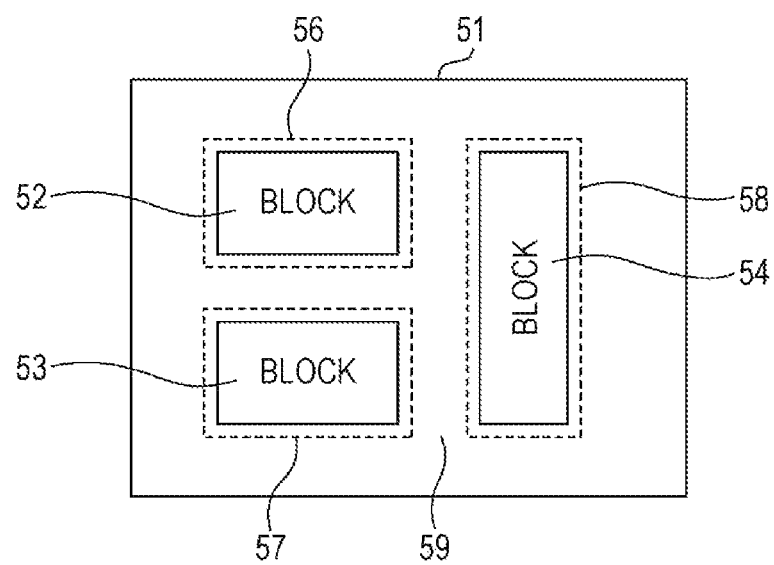
Figure 4C:
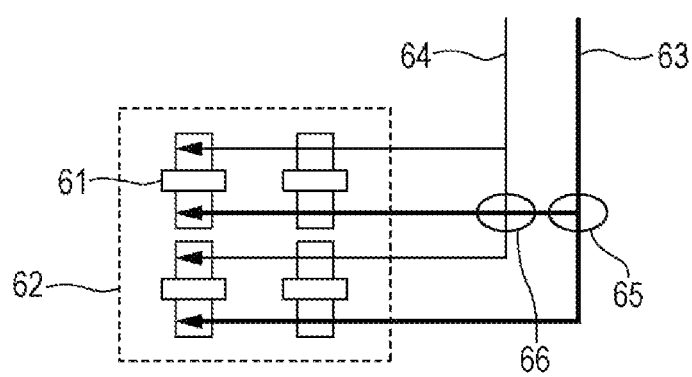
FIG. 4(C) is a view which shows a disposition of wirings connected to a transistor of a circuit block.

Next, a light shielding target region defined in a region in which the active element group is formed will be described. FIGS. 4(A) and 4(B) are schematic configuration views which show a planar disposition of a circuit block. FIG. 4(C) is a view which shows a disposition of wirings connected to a transistor of a circuit block.

As shown in FIGS. 4(A) and 4(B), a region on the substrate 51 in which the active element group is formed is set to a first circuit block 52, a second circuit block 53, and a third circuit block 54. Then, in FIG. 4(A), all regions of the first circuit block 52, the second circuit block 53, and the third circuit block 54 are indicated as a light shielding target region 55. Moreover, in FIG. 4(B), the first circuit block 52, the second circuit block 53, and the third circuit block 54 are independently indicated as light shielding target regions 56, 57, and 58, respectively.

As shown in FIG. 4(C), when setting an active element group in which a plurality of transistors 61 and the like are formed to a light shielding target region 62, wirings such as a wiring 63 and a wiring 64 are arranged in parallel in the light shielding target region. Therefore, it is necessary to provide a branch point 65 and an intersection 66 of the wiring 63 and the wiring 64 which are connected to each transistor 61 and configure the light shielding structure in a region except for the light shielding target region 62. In addition, it is necessary to perform wiring connection between blocks in the region except for the light shielding target region 62.

For this reason, as shown in FIG. 4(A), even when setting a plurality of circuit blocks to the light shielding target region 55, interference with the connection of wirings, or branching and intersection of wirings in the first to third circuit blocks 52 and 53 is caused. Since the light shielding structure in which a plurality of wiring layers are combined is configured in the light shielding target region 55, flexibility of the wiring layers is limited.

Then, as shown in FIG. 4(B), a circuit block in which an active element group is formed is divided into a first circuit block 52, a second circuit block 53, and a third circuit block 54, and these circuit blocks are set to respective independent light shielding target regions 56, 57, and 58. Then, a region except for the light shielding target regions 56, 57, and 58 is set to a light shielding non-target region 59.

In this manner, the light shielding target region is divided into circuit blocks of the active element group, and the light shielding structure which is formed of wirings is formed to cover each circuit block. Then, each space between circuit blocks is set to a light shielding non-target region. In this manner, a region in which wirings are arranged in parallel to configure the light shielding structure is limited, and the light shielding non-target region in which branching and intersection of wirings are performed is provided between circuit blocks, and thereby it is possible to improve flexibility of the wirings.

Moreover, in a light shielding target region, in addition to a region of the active element group paved with active elements which are light-emitting sources of hot carrier emissions, buffer zones which are a light shielding target region are provided in the periphery of the active element group. By providing the buffer zones in the periphery of the light-emitting source, it is possible to prevent light obliquely emitted from the light-emitting source.

Figure 5:
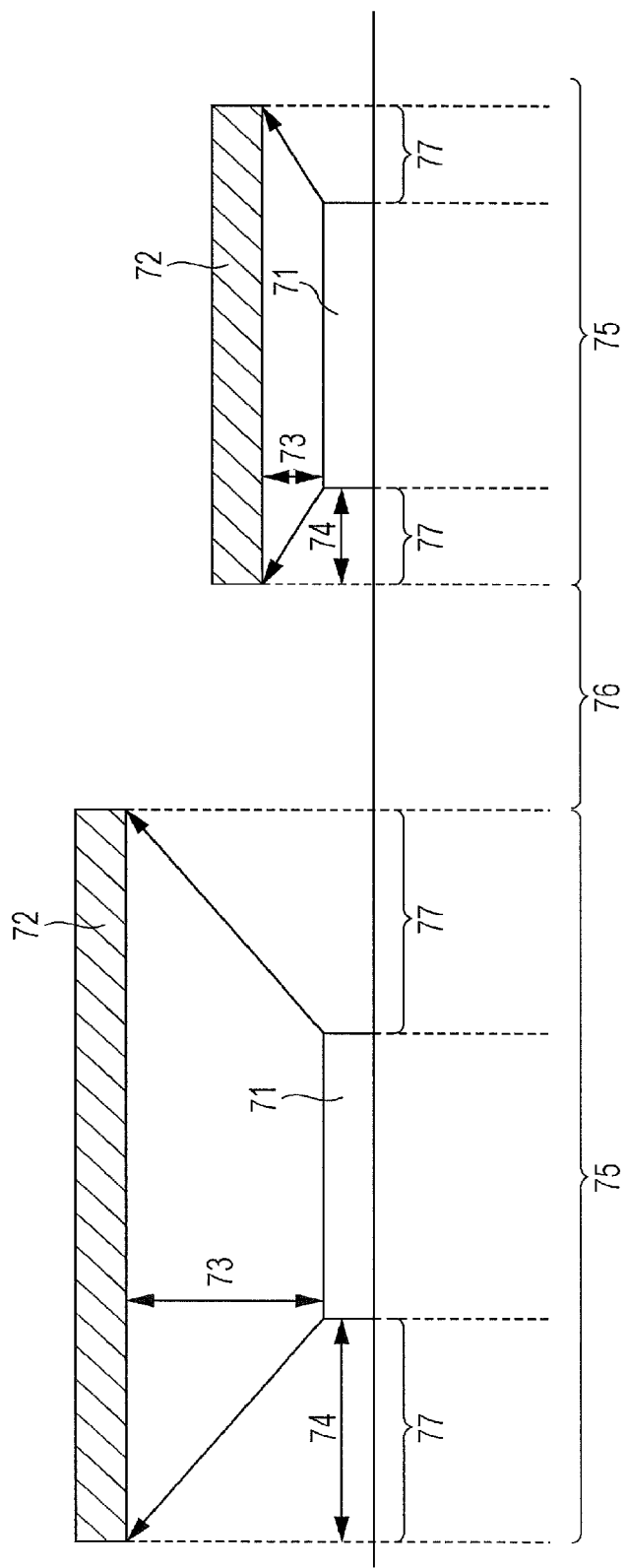
FIG. 5 is a view which shows a positional relationship between a light shielding target region and buffer zones.

FIG. 5 shows a relationship between a position of the light shielding target region and the buffer zones.

As shown in FIG. 5, a region in which the active element group 71 is formed and the buffer zones 77 in the periphery of the active element group 71 are set to a light shielding target region 75, and a space between the light shielding target regions 75 is set to a light shielding non-target region 76. Then, on the light shielding target region 75, the light shielding structure 72 which is formed of wirings is formed.

A length from the active element group 71 to the light shielding structure is set to an interlayer distance 73. In addition, a length from an end of the active element group 71 to an end of the light shielding structure which is formed of wirings is set to a buffer zone width 74. For example, the interlayer distance 73 can be set to a length from a light-emitting source of the hot carrier emissions to a bottom end of a wiring layer which configures the end of the light shielding structure. In addition, the buffer zone width 74 can be set to a length from the light-emitting source of the outermost hot carrier emissions in the active element group to an end of wirings which configure the light shielding structure.

At this time, the light shielding structure 72 is configured so that the buffer zone width 74 is larger than the interlayer distance 73. With this configuration, it is possible to shield an oblique light component of the hot carrier emission occurring as a point light source.

An appropriate value for a width of the buffer zones 77 is changed depending on a distance between the light shielding structure 72 and the active element group 71. For example, when configuring the light shielding structure on a wiring layer far away from a transistor, it is necessary to provide the buffer zones 77 in a large manner so as to sufficiently shield light obliquely emitted from the active element. On the other hand, when configuring the light shielding structure using a wiring layer at a low-rise side, it is possible to prevent the hot carrier emissions occurring from the active element even without providing the buffer zones 77 in a large manner. Accordingly, design flexibility of wirings is improved by providing the light shielding structure on the wiring layer at a low-rise side which is close to the active element group 71.

[The Light Shielding Structure Formed of Wirings]

Next, the light shielding structure which is formed of wirings and formed in the light shielding target region will be described.

Figure 6A:
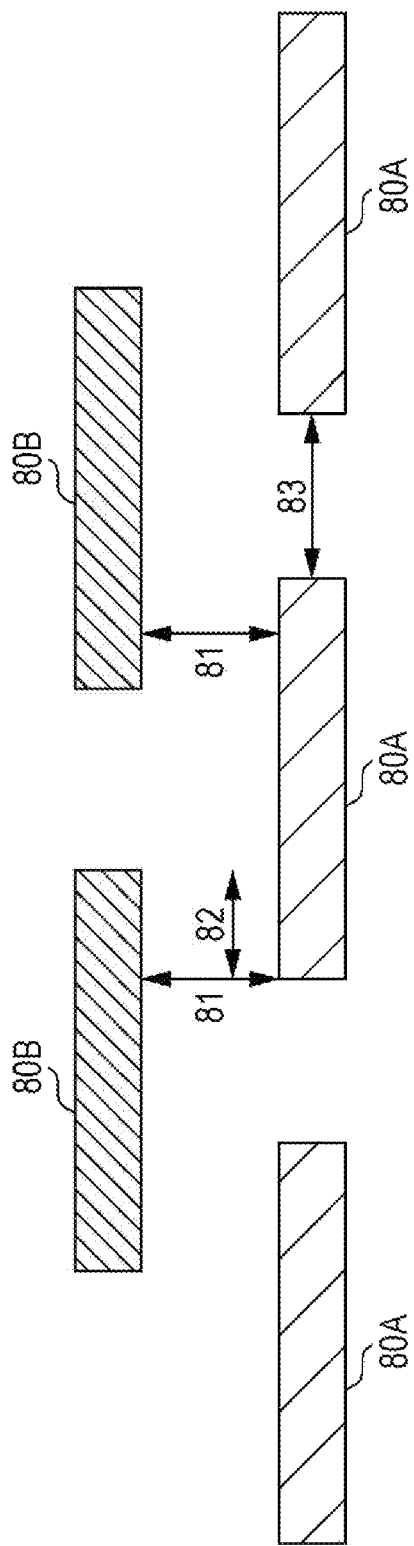
FIG. 6(A) is a cross-sectional structure of a wiring layer which configures a light shielding structure.
Figure 6B:
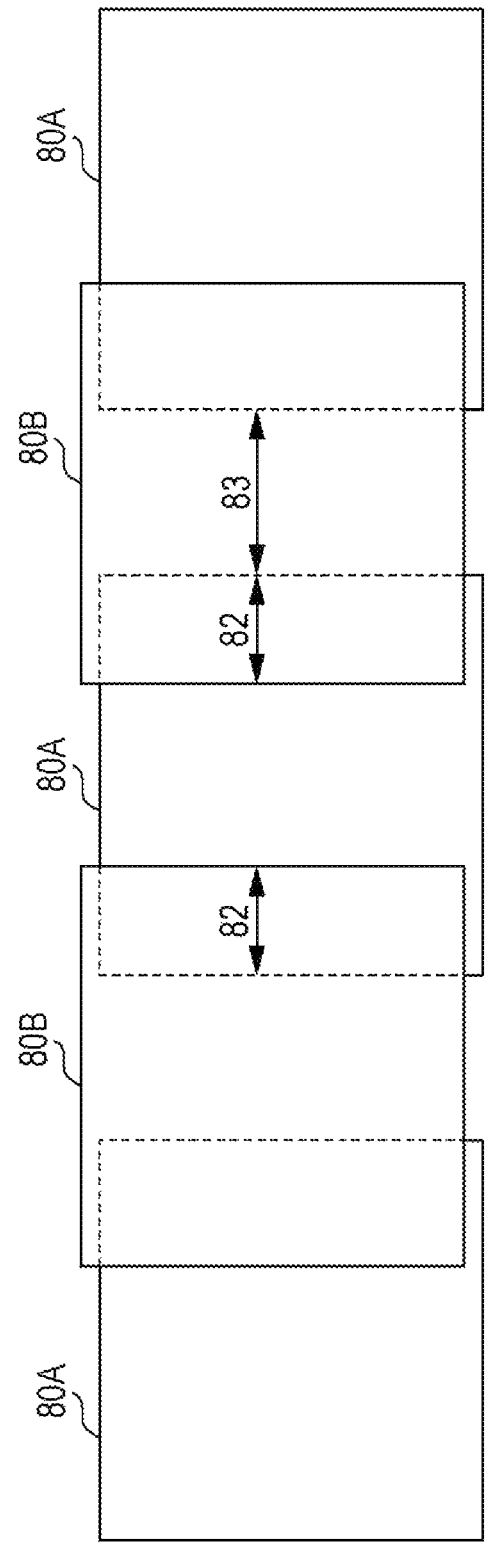
FIG. 6(B) is a planar structure of the wiring layer which configures a light shielding structure.

A configuration example of the light shielding structure which is formed of wirings is shown in FIGS. 6(A) and 6(B). FIG. 6(A) is a view which shows a cross-sectional structure of a wiring layer, and FIG. 6(B) is a view which shows a planar structure of the wiring layer.

By at least two-layer wirings 80A and 80B, the light shielding structure is configured.

In the light shielding structure, a laminated gap between at least two layers of a lower layer wiring 80A and an upper layer wiring 80B is set to an inter-wiring distance 81. In a similar way, a length of overlap between the lower layer wiring 80A and the upper layer wiring 80B in a planar direction is set to an amount of overlap 82. A gap between the lower layer wirings 80A is set to an opening width 83.

The amount of overlap 82 is determined by an inter-wiring distance 81 and an opening width 83. The hot carrier emission occurs as a point light source, such that it is necessary to shield even light emitted oblique directions. Therefore, by making an amount of overlap 82 at least greater than the inter-wiring distance 81, light-shielding properties of the hot carrier emission from the oblique directions are improved.

This combination is an example, and does not limit a configuration. For example, the light shielding structure may be configured by combining wiring layers of three layers or more as in the configuration described above. In addition, a position at which the wiring layers overlap each other and an amount of overlap are not limited to the above-mentioned configuration, but can be realized in any configuration.

<3. Second Embodiment of the Semiconductor Device>

Next, a configuration of a semiconductor device of a second embodiment will be described.

In the second embodiment, as a light-receiving element, a semiconductor device in which a high sensitivity analog element is formed will be described. In the second embodiment, it is possible to apply the same configuration of the semiconductor device as in the above-mentioned first embodiment except a configuration of the light-receiving element.

A structure of the semiconductor device of the second embodiment has the same configuration except that a photodiode PD which is a photoelectric conversion unit is set to a high sensitivity analog element in the solid-state imaging device indicated as an example of the semiconductor device in the above-mentioned first embodiment.

Figure 7:
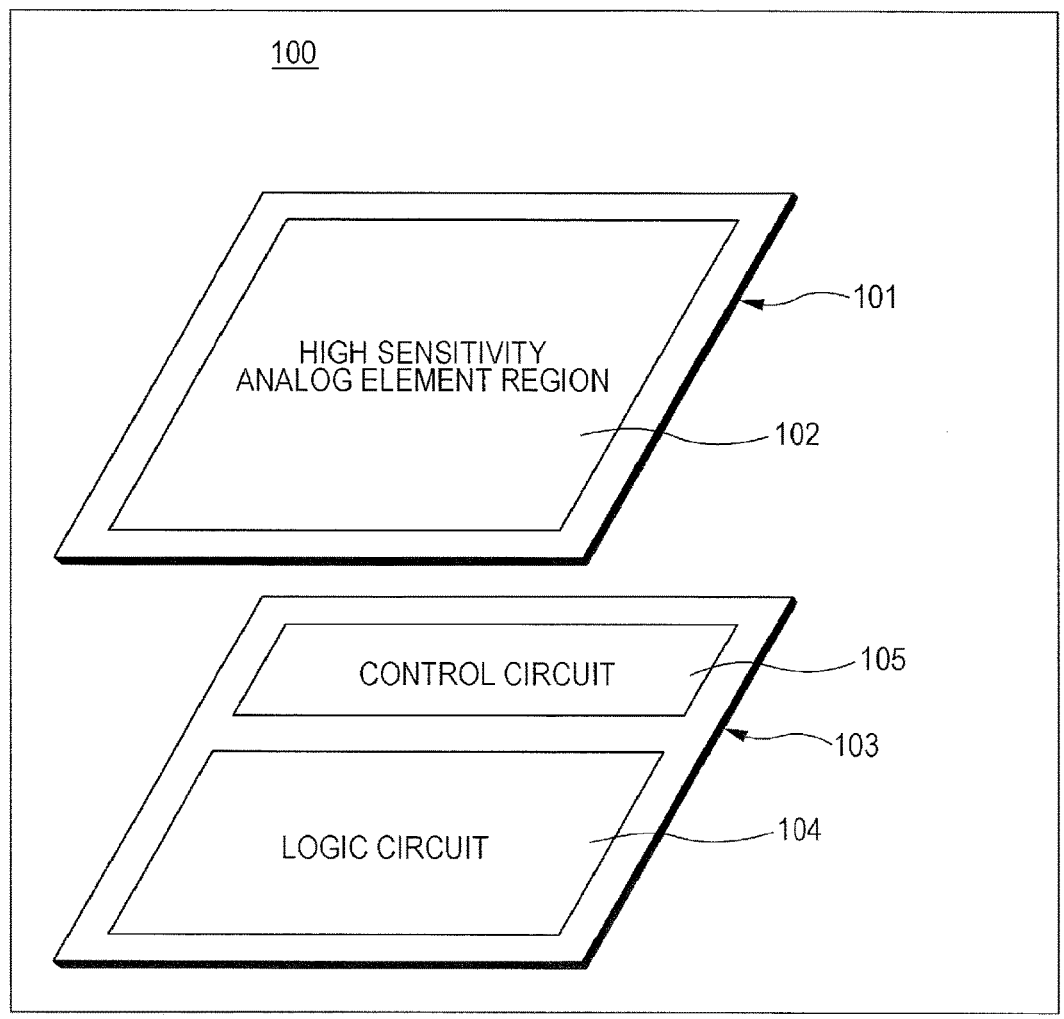
FIG. 7 is a schematic view which shows a structure of a semiconductor device of a second embodiment.

FIG. 7 shows a configuration of the semiconductor device of the second embodiment. FIG. 7 is a drawing corresponding to a configuration shown in FIG. 2(A) in a description of the semiconductor device of the above-mentioned first embodiment.

A semiconductor device 100 shown in FIG. 7 is configured by an electrical connection between the first semiconductor chip unit 101 and the second semiconductor chip unit 103 to each other. A high sensitivity analog element 102 is mounted in the first semiconductor chip unit 101. The control circuit 105 of the high sensitivity analog element and the logic circuit 104 including a signal processing circuit for signal processing are mounted in the second semiconductor chip unit 103.

In the semiconductor device having the above-mentioned configuration, the high sensitivity analog element 102, the control circuit 105, and the logic circuit 104 are configured to be disposed at a close distance. For this reason, the hot carrier emission occurring from the active element group is incident to the high sensitivity analog element 102 formed in the first semiconductor chip unit 101. That is, with respect to the hot carrier emission, the high sensitivity analog element receives an influence corresponding to the light-receiving element.

In the semiconductor device 100 having such a configuration, the occurrence of noise by a leakage of the hot carrier emissions to the high sensitivity analog element 102 becomes a problem.

Therefore, in the same manner as the above-mentioned first embodiment, an active element group which configures the control circuit 105 and the logic circuit 104 is divided into each region of a circuit block and each region is defined as a light shielding target region or a light shielding non-target region. Then, the light shielding structure in which wirings of different layers are combined is formed on a multilayer wiring layer on the light shielding target region. A definition of the light shielding target region and the light shielding structure which is formed of wirings can be configured the same as in the above-mentioned first embodiment.

According to the semiconductor device of the above-mentioned second embodiment, the light shielding structure which is formed of wirings is formed between the high sensitivity analog element 102 and the control circuit 105 and the logic circuit 104 which are vertically disposed at a close distance. With this configuration, hot carrier emission occurring at the control circuit 105 and the logic circuit 104 of the second semiconductor chip unit 103 are shielded in a wiring layer. Therefore, it is possible to suppress the hot carrier emissions so as not to be incident to the high sensitivity analog element of the first semiconductor chip unit 101.

Accordingly, the occurrence of noise of the high sensitivity analog element by the hot carrier emission is suppressed and a semiconductor device having an excellent reliability can be configured.

Even though not illustrated, a semiconductor device of the second embodiment may be configured to mount the high sensitivity analog element and the control circuit in the first semiconductor chip unit like the above-mentioned configuration shown in FIG. 2(B). Moreover, the first semiconductor chip unit may be configured to be mounted with the high sensitivity analog element and a control circuit unit which is suitable for control of the high sensitivity analog element which is a portion of the control circuit. Then, the second semiconductor chip unit may be configured to be mounted with the logic circuit and a control circuit unit which is suitable for control of a logic circuit which is the other portions of the control circuit.

<4. Modification Example of Semiconductor Device>
[Configuration Example of Solid-State Imaging Device: Surface-Irradiated Type Semiconductor Device]

In the above-mentioned first embodiment, a rear surface-irradiated type solid-state imaging device will be described as an example of the semiconductor device; however, the present technology can be applied even to a surface-irradiated type solid-state imaging device.

Even if not illustrated, for example, a solid-state imaging device which is configured by bonding the first semiconductor chip unit and the second semiconductor chip unit together may be configured.

In the first semiconductor chip unit, a pixel region in which a plurality of pixels made from a photodiode PD and a plurality of pixel transistors are arranged with a surface side of the semiconductor substrate serving as a light incident side is formed on a first semiconductor substrate which is thinned. Then, a multilayer wiring layer, a color filter, and an on-chip microlens are formed on a surface of the semiconductor substrate, and thereby the first semiconductor chip unit is made.

The second semiconductor chip unit is made by forming a peripheral circuit unit including a logic circuit and a control circuit for signal processing on a silicon semiconductor substrate, and forming a multilayer wiring layer on the semiconductor substrate. The logic circuit and the control circuit are configured to have an element such as a MOS transistor and the like.

Then, the second semiconductor substrate is bonded to a rear-side of the first semiconductor substrate through the multilayer wiring layer, and thereby the first semiconductor chip unit and the second semiconductor chip unit are bonded. The first semiconductor chip unit and the second semiconductor chip unit are electrically connected by a connection conductor in the same manner as in the above-mentioned first embodiment.

In such a surface-irradiated type solid-state imaging device, the light shielding structure which is formed of wirings is formed on a multilayer wiring layer of the second semiconductor chip unit. For example, an active element group formed in the second semiconductor substrate is divided into each region of a circuit block and each region is defined as a light shielding target region or a light shielding non-target region. Then, the light shielding structure which is formed of wirings is formed so as to cover the light shielding target region.

In a surface-irradiated type solid-state imaging device, the light shielding structure is disposed between the light-receiving element and the active element of the peripheral circuit unit which are vertically disposed at a close distance. With this configuration, hot carrier emission occurring from a logic circuit of the peripheral circuit units are shielded by the light shielding structure of the multilayer wiring layer of the second semiconductor chip unit, and are suppressed so as not to be incident to the light-receiving element of the first semiconductor chip unit. Accordingly, the hot carrier emissions imaged in a pixel region are reduced, and thus it is possible to provide a solid-state imaging device with an improved image quality.

In a configuration of the above-mentioned surface-irradiated type solid-state imaging device, a light-receiving element is replaced with a high sensitivity analog element, and thereby it is possible to apply the configuration of the semiconductor device of the above-mentioned modification example to a semiconductor device shown in the above-mentioned second embodiment.

<5. Electronic Equipment>
[Configuration Example of Electronic Equipment]

Next, an embodiment of electronic equipment including the above-mentioned solid-state imaging device will be described.

Figure 8:
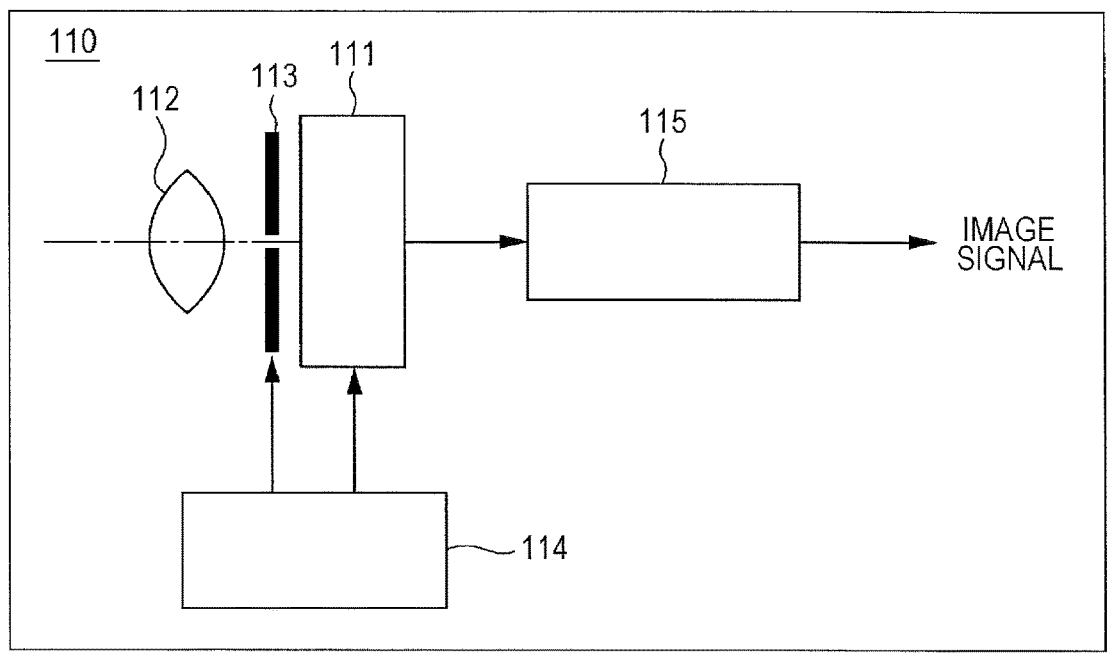
FIG. 8 is a view which shows a configuration of electronic equipment.

The above-mentioned solid-state imaging device can be applied to electronic equipment which includes a camera system such as a digital camera, a video camera, or the like, a mobile phone with an imaging function, other equipment having an imaging function, or a semiconductor device having a high sensitivity analog element such as a flash memory and the like. FIG. 8 shows a schematic configuration, as an example of the electronic equipment, when applying a semiconductor device made from the solid-state imaging device to a camera which can take a still image or a moving image.

The camera 110 of the example includes a solid-state imaging device 111, an optical system 112 leading incident light to a light-receiving sensor unit of the solid-state imaging device 111, a shutter device 113 provided between the solid-state imaging device 111 and the optical system 112, and a drive circuit 114 which drives the solid-state imaging device 111. Furthermore, the camera 110 includes a signal processing circuit 115 which processes an output signal of the solid-state imaging device 111.

It is possible to apply the semiconductor device shown in each embodiment and a modification example described above to the solid-state imaging device 111. The optical system (optical lens) 112 allows image light (incident light) from a subject to be imaged on an imaging surface (not illustrated) of the solid-state imaging device 111. Accordingly, in the solid-state imaging device 111, signal charges are accumulated during a fixed time. The optical system 112 may be configured to have a group of optical lens which includes a plurality of optical lens. In addition, the shutter device 113 controls a light shielding period and a light irradiation period of the incident light to the solid-state imaging device 111.

The drive circuit 114 supplies a drive signal to the solid-state imaging device 111 and a shutter device 113. Then, the drive circuit 114, by a supplied drive signal, suppresses a signal output operation of the solid-state imaging device 111 to the signal processing circuit 115 and a shutter operation of the shutter device 113. That is, in the example, by the drive signal (timing signal) supplied from the drive circuit 114, a signal transmission operation from the solid-state imaging device 111 to the signal processing circuit 115 is performed.

The signal processing circuit 115 performs various signal processing on a signal transferred from the solid-state imaging device 111. Then, a signal (video signal) on which various signal processing is performed is stored in a storage medium (not illustrated) such as a memory and the like, or is output to a monitor (not illustrated).

According to electronic equipment like the above-mentioned camera 110 and the like, in the solid-state imaging device 111, it is possible to suppress the occurrence of noises caused by leakage of light such as hot carrier emissions and the like from an active element such as a diode and the like to the light-receiving element. Accordingly, it is possible to provide high quality electronic equipment with an improved image quality.

The above-mentioned electronic equipment can configure a camera and others by replacing the solid-state imaging device with a semiconductor device including a high sensitivity analog element, and configuring a drive circuit or a signal processing circuit in the semiconductor device as necessary.

In addition, in each of the above-mentioned embodiments, an example in which the light shielding structure is configured to have two-layer wiring layer is described; however, the number of wiring layers used in the light shielding structure may be throe layers or more. In this case, by making an amount of overlap of a wiring greater than an inter-wiring distance of a wiring layer, it is possible to configure the light shielding structure. In addition, in each of the above-mentioned embodiments, the light shielding structure is configured on a wiring layer of a semiconductor chip side in which a logic circuit is formed; however, the light shielding structure can be configured at any position on a wiring layer if the wiring layer is between an active element which is a light-emitting source of the hot carrier emissions and a light-receiving element.

The present disclosure can be obtained by a following configuration.

(1) A semiconductor device including a light-receiving element, an active element for signal processing, and a light shielding structure which is between the light-receiving element and the active element to cover the active element and is formed of wirings.

(2) The semiconductor device according to (1) further including a first substrate on which the light-receiving element is formed, a second substrate on which the active element is formed, and a wiring layer which has a light shielding structure which is formed of the wiring and formed on the second substrate, and in which the second substrate is bonded to the first substrate through the wiring layer.

(3) The semiconductor device according to (2), in which, in a region in which the active element of the second substrate is formed, a light shielding target region and a light shielding non-target region are defined, the light shielding structure is configured in the light shielding target region, and an intersecting portion of the wiring which configures the light shielding structure is provided in the light shielding non-target region.

(4) The semiconductor device according to (3), in which, in a region in which the active element of the second substrate is formed, an active element group in which a plurality of the active elements are provided is divided into circuit blocks, the circuit blocks are defined as the light shielding target region, and a space between the circuit blocks is defined as a light shielding non-target region.

(5) The semiconductor device according to (4), in which buffer zones having a width wider than a distance from the active element group to the light shielding structure are provided in a periphery of the active element group, and the light shielding structure is configured in the active element group and on the buffer zones.

(6) The semiconductor device according to any one of (1) to (5), in which the light shielding structure is made from a first wiring arranged in parallel, and a second wiring which is formed on a wiring layer different from the first wiring, and the first wiring and at least a portion thereof are arranged to be overlapped with each other in parallel on a plane position.

(7) The semiconductor device according to any one of (1) to (6), in which the light-receiving element is a photoelectric conversion element.

(8) The semiconductor device according to any one of (1) to (6), in which the light-receiving element is a high sensitivity analog element with respect to light noises.

(9) Electronic equipment including the semiconductor device according to any one of (1) to (8), and a signal processing circuit which processes an output signal of the semiconductor device.

REFERENCE SIGNS LIST 1, 111 solid-state imaging device
2 pixel
3, 23 pixel region
4 vertical drive circuit
5 column signal processing circuit
6 horizontal drive circuit
7 output circuit
8, 24, 105 control circuit
9 vertical signal line
10 horizontal signal line
12 input and output terminal
21, 27 MOS type solid-state imaging device
22, 31, 101 first semiconductor chip unit
25, 104 logic circuit
26, 41, 103 second semiconductor chip unit
32 first semiconductor substrate
33, 43 multilayer wiring layer
34 light-receiving element
35 optical member
40, 72 light shielding structure
44 MOS transistor
45 first wiring
46 second wiring
47, 71 active element group
48, 55, 56, 62, 75 light shielding target region
49, 59, 76 light shielding non-target region
51 substrate
52 first circuit block
53 second circuit block
54 third circuit block
61 transistor
63, 64, 80A, 805 wiring
65 branch point
66 intersection
73 interlayer distance
74 buffer zone width
77 buffer zones
81 inter-wiring distance
82 amount of overlap
83 opening width
100 semiconductor device
102 high sensitivity analog element
110 camera
112 optical system
113 shutter device
114 drive circuit
115 signal processing circuit

The invention claimed is:
1. A semiconductor device, comprising:
a first substrate including a light-receiving element in a first semiconductor substrate;
a second substrate on the first substrate, the second substrate including:
an active element in a first direction in a second semiconductor substrate, and
a light shielding structure between the light-receiving element and the active element; and buffer zones on both sides of the active element, wherein a width of each of the buffer zones is wider than a distance from the active element to the light shielding structure, and wherein, in a cross-sectional view, the light shielding structure includes:
- a first wiring layer that includes a first wiring and a second wiring;
- a second wiring layer that includes a third wiring; and
- an inter-wiring region between the first wiring and the second wiring,
- wherein the inter-wiring region is above the active element, and wherein the third wiring overlaps the inter-wiring region.

2. The semiconductor device according to claim 1, wherein the second semiconductor substrate is bonded to the first semiconductor substrate through the light shielding structure.

3. The semiconductor device according to claim 2, wherein an origin of the second wiring is from a branch point of the first wiring, and wherein the light shielding structure has a first portion of the first wiring parallel to a second portion of the second wiring.

4. The semiconductor device according to claim 1,
- wherein the active element is divided into a plurality of circuit blocks,
- wherein a first region that corresponds to a circuit block of the plurality of circuit blocks is a light shielding target region, and
- wherein a second region between the plurality of circuit blocks is a light shielding non-target region.

5. The semiconductor device according to claim 1, wherein the light-receiving element is a photoelectric conversion element.

6. The semiconductor device according to claim 1, wherein the light-receiving element is a high sensitivity analog element with a high sensitivity to light noises.

7. An electronic equipment, comprising:
- a first substrate including a light-receiving element in a first semiconductor substrate;
- a second substrate on the first substrate, the second substrate including:
  - an active element in a first direction in a second semiconductor substrate, and
  - a light shielding structure between the light-receiving element and the active element; and
- buffer zones on both sides of the active element, wherein a width of each of the buffer zones is wider than a distance from the active element to the light shielding structure, and
- wherein, in a cross-sectional view, the light shielding structure includes:
  - a first wiring layer that includes a first wiring and a second wiring;
  - a second wiring layer that includes a third wiring; and
  - an inter-wiring region between the first wiring and the second wiring,
  - wherein the inter-wiring region is above the active element, and
  - wherein the third wiring overlaps the inter-wiring region.

8. A semiconductor device, comprising:
- a layer of lower wirings in a light shielding structure, wherein the layer of lower wirings comprises a first wiring and a second wiring;
- a layer of upper wirings in the light shielding structure, wherein the layer of upper wirings comprises a third wiring;
- a first active element in a first light shielding target region of a semiconductor substrate; and
- buffer zones on both sides of the first active element, wherein a width of each of the buffer zones is wider than a distance from the first active element to the light shielding structure.

9. The semiconductor device according to claim 8, wherein an inter wiring distance in a first direction in a cross-sectional view of the light shielding structure is a gap between the layer of lower wirings and the layer of upper wirings, wherein the third wiring of the layer of upper wirings overlays a portion of the second wiring of the layer of lower wirings by an amount of overlap, and wherein the amount of overlap is at least greater than the inter wiring distance.

10. The semiconductor device according to claim 8, further comprising, in a cross-sectional view of the light shielding structure, an insulation between the first wiring of the layer of lower wirings and the second wiring of the layer of lower wirings.

11. The semiconductor device according to claim 8, wherein an opening width in a cross-sectional view of the light shielding structure is a gap between the first wiring of the layer of lower wirings and the second wiring of the layer of lower wirings.

12. The semiconductor device according to claim 8, further comprising a light-receiving element between an optical member and the layer of upper wirings.

13. The semiconductor device according to claim 12, wherein the light-receiving element is a photodiode.

14. The semiconductor device according to claim 8, wherein the layer of lower wirings is between the first active element and the layer of upper wirings.

15. The semiconductor device according to claim 14, further comprising a light shielding non-target region of the semiconductor substrate, wherein the light shielding non-target region is between the first light shielding target region of the semiconductor substrate and a second light shielding target region of the semiconductor substrate.

16. The semiconductor device according to claim 15, further comprising a second active element in the second light shielding target region.

17. The semiconductor device according to claim 15, wherein an interlayer distance is a length from the first active element to the light shielding structure, and a buffer zone width is a distance from the first active element to the light shielding non-target region, and wherein the buffer zone width is larger than the interlayer distance.

18. An electronic equipment, comprising:
- a semiconductor device, comprising:
  - a layer of lower wirings in a light shielding structure;
  - a layer of upper wirings in the light shielding structure;
  - a first active element in a first light shielding target region of a semiconductor substrate; and
  - buffer zones on both sides of the first active element, wherein a width of each of the buffer zones is wider than a distance from the first active element to the light shielding structure.

19. The semiconductor device according to claim 1, wherein an amount of overlap between the third wiring and each of the first wiring and the second wiring is the same.

* * * * *